US000001287H

United States Statutory Invention Registration [19]

[11] Reg. Number: H1287

[43] Published: Feb. 1, 1994

Zeisse et al.

[54] ION IMPLANTED DIAMOND METAL-INSULATOR-SEMICONDUCTOR FIELD EFFECT TRANSISTOR

[75] Inventors: Carl R. Zeisse; James R. Zeidler; Charles A. Hewett; Richard Nguyen, all of San Diego, Calif.

[73] Assignee: The United States of America as represented by the Secretary of the Navy, Washington, D.C.

[21] Appl. No.: 901,615

[22] Filed: Jun. 16, 1992

[51] Int. Cl.[5] ..... H01L 29/78

[52] U.S. Cl. ..... 257/410; 257/77; 257/289; 257/648

[58] Field of Search ..... 257/77, 412

[56] References Cited

U.S. PATENT DOCUMENTS

| | | | |
|---|---|---|---|
| 4,571,447 | 2/1986 | Prins | 136/252 |
| 4,740,263 | 4/1988 | Imai et al. | 156/613 |
| 4,849,797 | 7/1989 | Ukai et al. | 357/23.7 |
| 4,875,083 | 10/1989 | Palmour | 357/23.6 |
| 4,929,986 | 5/1990 | Yoder | 357/22 |
| 5,030,583 | 7/1991 | Beetz, Jr. | 437/39 |
| 5,051,785 | 9/1991 | Beetz, Jr. et al. | 357/4 |
| 5,055,424 | 10/1991 | Zeidler et al. | 437/188 |
| 5,072,264 | 12/1991 | Jones | 257/77 |
| 5,099,296 | 3/1992 | Mort et al. | 357/22 |
| 5,107,315 | 4/1992 | Kumagai et al. | 257/77 |
| 5,173,761 | 12/1992 | Dreifus et al. | 257/77 |

OTHER PUBLICATIONS

Carl R. Zeisse et al, An Ion-Implanted Diamond Metal-Insulator-Semiconductor Field Effect Transistor, believed published in IEEE's Electron Device Letters in Nov. 1991.

Charles A. Hewett et al, Fabrication Of An Insulated Gate Diamond FET For High Temperature Applications, believed to be published in the Proceedings of the Hi-Temperature Electronics Conference, 16-20 Jun. 1991.

*Primary Examiner*—Bernarr E. Gregory

*Attorney, Agent, or Firm*—Harvey Fendelman; Thomas Glenn Keough; Michael A. Kagan

[57] ABSTRACT

A field effect transistor comprises a diamond substrate which has a p-type ion implanted region coterminous with a surface of the diamond substrate, wherein the ion implanted region has a hole concentration in the range of $1\times10^{15}$ to $1\times10^{17}$ holes/cm$^2$, and a hole mobility equal to or greater than 1 cm$^2$/V-sec; spaced apart source and drain electrodes formed over the p-type ion implanted region on the surface of the diamond substrate; an electrically insulating material formed over the p-type ion implanted region on the surface of the diamond substrate between the source and drain electrodes; and a gate electrode formed on the surface of the insulating material.

17 Claims, 2 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

ION IMPLANTED DIAMOND METAL-INSULATOR-SEMICONDUCTOR FIELD EFFECT TRANSISTOR

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The present invention relates to the field of transistors, and more specifically to the field of metal-insulator-semiconductor field effect transistors formed on diamond substrates.

Transistors are solid state devices which amplify electrical signals and, when combined in large numbers close together on a single substrate, make up integrated circuits. Integrated circuits are employed in a wide variety of electronic applications, as for example, in microprocessors and computers.

Transistors are generally manufactured from wafers of single crystal silicon. However, the speed of silicon transistors is limited by the modest speed with which electrons flow within silicon conductive layers, and the lack of a sufficiently insulating form of silicon with which to produce low capacitance interconnections between devices. The speed of a transistor refers to its switching time. The speed limitations of silicon based transistors have been overcome by fabricating transistors from gallium arsenide. However, a gallium arsenide transistor is limited in its ability to operate at temperatures higher than about 450 K.

Diamond is a material with properties which theoretically allow transistor operation not only at higher speeds than gallium arsenide, but also at very high temperatures (perhaps as high as 900 K.). High temperature operation would be extend electronics into extreme thermal environments such as the inside of an operating airplane engine, deep within the earth in an oil drill hole, or in space vehicles operating in outer space without any cooling capability.

The first transistor behavior in diamond was demonstrated by J. F. Prins in 1982 [See J. F. Prins, "Bipolar Transistor Action In Ion Implanted Diamond," *Appl. Phys. Lett.*, Vol. 41, p. 950, 1982.]The transistor developed by Prins was a so-called bipolar transistor which depended for its operation on the creation of adjacent regions in which electrons carried a majority of the current (called n-type regions) and holes carried a majority of the current (called p-type regions). In the Prins transistor, the p-type region was realized by starting with a substrate of naturally occurring diamond, called type IIb, a p-type material. The n-type region was made by directing an ion beam to impinge the surface of IIb diamond crystal to implant positive ions in the substrate in a process called ion implantation. Although the current-voltage characteristics of the Prins diamond transistor were typical of a bipolar transistor, the gain of the device was not significant.

The first diamond transistor with significant gain was a so-called point contact transistor made by M. W. Geis, et al, in 1987 [See M. W. Geis, D. D. Rathman, D. J. Ehrlich, R. A. Murphy, and W. T. Lindley, "High-Temperature Point-Contact Transistors And Schottky Diodes Formed On Synthetic Boron-Doped Diamond," *IEEE Electron Device Lett.*, Vol. EDL-8, p. 341, 1987.]To make this transistor, Geis pressed tungsten points against the surface of a synthetic boron doped diamond crystal, which became a p-type semiconductor. Electron emission and collection regions were formed under each point. An advantage of the Geis transistor is that it provides a small signal current gain, which is defined as the ratio of change in output current to change in input current. At room temperature, the small signal current gain was about 20. The current gain decreased to about 2 at an operating temperature of 783 K. However, a principal disadvantage of the point contact transistor demonstrated by Geis is that it can not easily be reduced in size and combined with similar transistors to make a integrated circuit.

In 1991, reports began to appear in the open literature of planar diamond transistors which operated through the field effect. [See W. Tsai, M. Delfino, D. Hodul, R. Riaziat, L. Y. Ching, G. Reynolds, and C. B. Cooper, III, "Diamond MESFET Using Ultrashallow RTP Boron Doping," *IEEE Electron Device Lett.*, Vol. EDL-2, p. 157, 1991; G. Sh. Gildenblat, S. A. Grot, C. W. Hatfield, and A. R. Badzian, "High-Temperature Thin-Film Diamond Field-Effect Transistor Fabricated Using A Selective Growth Method," *IEEE Electron Device Lett.*, Vol. 12, p. 37, 1991.]Such transistors are called field effect transistors. "A field effect transistor is a transistor in which current carriers (holes or electrons) are injected at one terminal (the source) and pass to another (the drain) through a channel of semiconductor material whose resistivity depends mainly on the extent to which it is penetrated by a depletion region. The depletion region is produced by surrounding the channel with semiconductor material of the opposite conductivity and reverse-biasing the resulting p-n junction from a control terminal (the gate). The depth of the depletion region depends on the magnitude of the reverse bias." [Graf, r.f., *Modern Dictionary of Electronics*, Howard W. Sams & Co., Inc., p. 272, 1977.]

Field effect transistors are made by creating conducting layer near the surface of a semiconductor single crystal. The conducting layer is called a channel. For highest speed the semiconductor should be semi-insulating, that is, it should have a bulk resistivity of more than $10^6$ or $10^7$ ohm-cm. For high temperature operation the semiconductor should have a band gap of about 2 electron volts or more.

After creation of the conducting layer, ohmic electrical contact is made to the channel by forming two electrodes on the surface of the conducting layer. One electrode is called the source contact and one electrode is called the drain contact. A third electrode, referred to as a gate electrode, may be formed by depositing a metal directly on the channel, to create a metal-semiconductor field effect transistor. For a variety of reasons, including work function differences between the gate metal and semiconductor substrate, there is generally an electric field underneath the gate extending part way into the channel. The phrase "work function" refers to the amount of energy required to raise an electron from the Fermi level to the vacuum level. The field polarity is chosen in such a way that the flow of charge carriers in the channel is controlled in the region under the gate just as the flow of water is controlled by adjusting a valve in a water circuit. By changing the voltage on the gate electrode, the field in the channel can be changed causing the amount of current flowing inside the channel from source to drain to also be changed. A figure of merit of the transistor 10 of the present invention device is the ratio of the change in channel current to a change in gate voltage, called the transconductance, $g_m$, of the transistor. The dimensions of transconductance are current/voltage, or Siemens.

By applying appropriate voltage at the source, drain, and gate electrodes, an electrical current may be induced to flow through the channel, entering through the source and leaving through the drain in much the same way water can be made to flow in one end and out the other end of a pipe.

W. Tsai et al. has made an FET on a diamond substrate having a transconductance of 1.6 μS for each mm of gate width in accordance with the method described above. The channel in the Tsai transistor was made by placing a solid disk of boron nitride next to a piece of natural semi-insulating diamond and rapidly raising the temperature of both for time just sufficient for the boron ions to diffuse into the diamond and change, or "dope," the ion implanted region of the diamond into a p-type structure. One problem with Tsai's transistor was that it never achieved what is called current saturation, that is, it was never able to conduct a channel current as large as the channel was capable of handling. Because of this, the transconductance of the Tsai transistor was lower than it might otherwise have been. Saturation is required for low output conductance. Output conductance is the ratio of the change in channel current to the change in channel voltage where these changes are measured while keeping the gate voltage constant. Because the voltage gain of a transistor driving a large impedance load is given by the ratio of transconductance to output conductance, lack of saturation furthermore resulted in low voltage gain from the Tsai transistor.

As an alternative to forming a metal gate electrode directly on the channel, a gate electrode for a field effect transistor may also be manufactured by first depositing or growing an insulator, such as silicon dioxide, over the channel and then placing the gate electrode on top of the insulator. This device is called a metal-insulator-semiconductor field effect transistor or "MISFET." G. Sh. Gildenblat, et al., describes growing a channel directly on a diamond substrate using the well known technique of homoepitaxy. Channel growth was selective, that is, arrangements were made to grow the channel over certain parts of the substrate rather than over the entire surface of the substrate (which would have been called non-selective growth). The Gildenblat device operated at 573 K. and had a transconductance per unit gate width of 30 $\mu S\ mm^{-1}$. However, the Gildenblat device did not exhibit strong evidence of saturation in its transistor behavior, nor did it show any evidence of pinch-off, i.e., the ability to significantly reduce the channel current towards zero.

SUMMARY OF THE INVENTION

The transistor of the present invention is a metal-insulator-semiconductor field effect transistor (MISFET) which includes a diamond substrate having a p-type ion implanted region coterminous with a surface of the diamond substrate. The process of ion implantation, which may be selective or non-selective, provides precise control of the dopant level of the ion implanted region, or channel of the diamond substrate. The transistor further includes spaced apart source and drain electrodes formed over the p-type region on the surface of the diamond substrate; an electrically insulating material formed over the p-type ion implanted region on the surface of the diamond substrate between the source and drain electrodes; and a gate electrode formed on the surface of the insulating material. More specifically, the ion implanted region has a hole concentration in the range of $1\times10^{15}$ to $1\times10^{17}$ holes/cm$^2$, and a hole mobility equal to or greater than 1 cm$^2$/V-sec.

The ion implanted region is preferably manufactured by a) cooling the diamond substrate to a temperature of about 80 K.; b) bombarding the surface of the cooled diamond substrate with about $1.5\times10^{14}$ ions per cm$^2$, the ions having an energy of about 25 keV; c) bombarding the surface of the cooled diamond substrate with about $2.1\times10^{14}$ ions per cm$^2$, the ions having an energy of about 50 keV; d) bombarding the surface of the cooled diamond substrate with about $3.0\times10^{14}$ ions per cm$^2$, the ions having an energy of about 100 keV; and e) after bombarding the diamond substrate, placing the cooled diamond substrate in a furnace having a non-oxidizing atmosphere maintained at a temperature of about 1260 K. to anneal the diamond substrate and to activate the implanted ions.

The transistor exhibits well developed saturation, good pinch-off of the channel current, and low output conductance. As a consequence of these characteristics, the transistor exhibits excellent low frequency voltage gain for a diamond based transistor.

A important advantage of the transistor of the present invention is that it includes source and drain electrodes which provide ohmic contact with low electrical resistance to the channel which makes the transistor more responsive to voltage changes.

Another advantage of the transistor of the present invention is that it provides saturation of the channel current at reasonable drain voltages.

Still another advantage of the transistor of the present invention is that it demonstrates good pinch-off.

A still further advantage of the transistor of the present invention is that it provides low output conductance and relatively high gain for a diamond based transistor, particularly at low frequencies.

These and other advantages and/or features will become more readily apparent in light of the ensuing specification, drawings and claims.

DESCRIPTION OF THE PREFERRED EMBODIMENT

Figure 1:
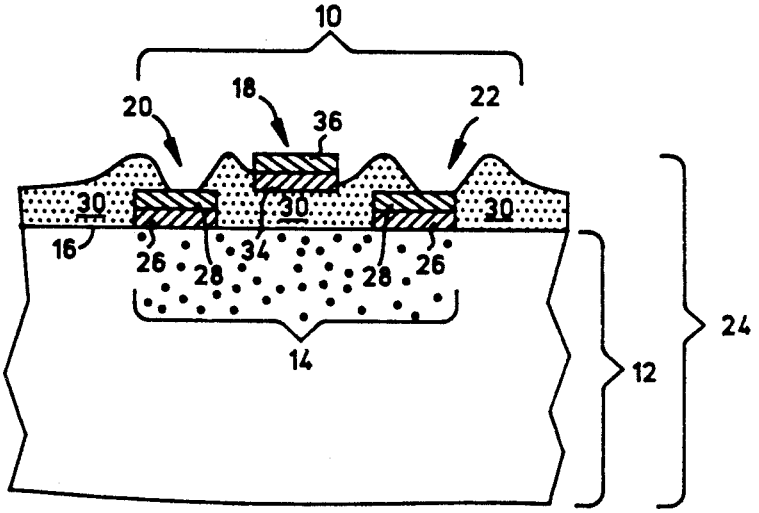
FIG. 1. is a cross-sectional view of an ion implanted diamond MISFET embodying various features of the present invention.

The present invention provides metal insulated semiconductor field effect transistor ("MISFET") 10 formed on a semiconducting diamond substrate 12. The diamond substrate 12 is preferably a type IIa semi-insulating diamond which typically has a bulk resistivity of more than $10^6$ ohm-cm.

In the manufacture of the transistor, or MISFET 10, the diamond substrate 12 is placed in an ion implanter in which a channel, or ion implanted region 14 is created in the diamond substrate using the technique of selective ion implantation to mask separate areas of the diamond substrate 12 before implantation. Then the separate regions which become the channels 14, only one of which is shown, are formed by bombarding specific areas of the surface 16 of the substrate 12 with p-type ions, which are preferably boron ions, and thus transforming the surface 16 into an ion implanted surface. In order to attain relative uniform doping with respect to the depth of the ion implanted region 14, the p-type ions are preferably implanted into the diamond substrate 12 by a series of one or more steps each involving bombarding the surface 16 of the diamond substrate 12 with a particular combination of ion density (ions/$cm^2$) and ion energy. By way of example, the channel 14 is preferably manufactured by a) bombarding the surface 16 of the diamond substrate 12 with about $1.5\times10^{14}$ positive ions per $cm^2$, where the ions have an energy of about 25 keV; b) bombarding the surface 16 of the diamond substrate 12 with about $2.1\times10^{14}$ positive ions per $cm^2$, where the ions have an energy of about 50 keV; and c) bombarding the surface 16 of the diamond substrate 12 with about $3.0\times10^{14}$ positive ions per $cm^2$, where the ions have an energy of about 100 keV. While the ions are being implanted within the diamond substrate 12, the substrate is maintained at a temperature of about 80 K. This process results in the manufacture of a p-type region, or channel 14 having a generally uniform doping distribution with respect to the depth of the p-type region in the diamond substrate 12. The order in which the diamond substrate 12 is bombarded at these different combinations of ion densities and energies may be other than as set forth above.

The ion implanted region 14, or channel, may also be manufactured by bombarding the surface 16 in a series of one or more steps involving combinations of ion density and ion energies other than those described above. For example, the surface 16 may be bombarded in one step with p-type ions at one energy, although this latter method would provide a Gaussian doping distribution with respect to depth within the channel 14. In an example of one implementation of the transistor, the p-type layer may be about 210 nm in depth.

After implantation, the cooled diamond substrate 12 is removed from the ion implanter and quickly placed in a furnace preheated to about 1260 K. before the diamond substantially heats up from the low temperature at which it was maintained while being bombarded. The diamond substrate should remain in the furnace for at least about 10 minutes. The furnace preferably has a non-oxidizing atmosphere, such as nitrogen, argon, or hydrogen to prevent oxidation of the diamond. Heating the ion implanted diamond substrate 12 to about 1260 K. allows the implanted region 12 to be annealed in order to remove implantation damage caused to the crystalline structure of the diamond substrate as a result of the ion implanting process. Heating the substrate 12 also activates the implanted ions, thereby providing the diamond substrate 12 with a p-type region having a generally uniform doping distribution with respect to the depth of the p-type region in the diamond substrate.

Optionally, the carrier concentration and carrier mobility in the channel, i.e., the p-type region 14, may be determined by performing a series of van der Pauw resistivity and Hall effect measurements as a function of temperature and ambient atmosphere to confirm that the conductivity of the p-type region of the diamond substrate 12 satisfies the design requirements of the transistor 10. Techniques for performing such measurements are well known by those skilled in the art, as set forth in P. R. de la Houssaye, et al. "Hall Mobility and Carrier Concentration vs. Temperature for Natural Insulating Diamond Doped With Boron By Ion Implantation", *Journal of Applied Physics,* 71(7), 3220–3224 (1992).

The diamond substrate 12 next is etched in a boiling saturated solution of chromic oxide, $CrO_3$ and sulfuric acid in order to remove any damage on the diamond surface 16 resulting from the ion implantation. If the optional step of performing van der Pauw and Hall measurements is taken, the acid etch also removes any electrical contacts formed on the diamond substrate 12 in order to perform the van der Pauw and Hall measurements.

Still referring to FIG. 1, the MISFET transistor 10 includes a gate 18, source 20, and drain 22 electrodes which comprise a structure 24. The source and drain electrodes 20 and 22, respectively, each require ohmic contact to the implanted channel 14. The ohmic contact between each of the source and drain electrodes 20 and 22, respectively, and the p-type region of the diamond substrate 12, or channel 14, may be achieved by depositing a thin layer, as for example, 10 nm, of a carbide forming metal 26, such as molybdenum, tungsten, chromium, vanadium, niobium, tantalum, titanium, nickel, cobalt, iron, manganese, silicon, boron, zirconium, or hafnium, on the surface 16 of the diamond substrate 12 coterminous with the p-type region, or channel 14, and then depositing a layer of a corrosion resistant metal 28 over the carbide forming metal. Examples of corrosion resistant metals include gold, platinum, palladium, and nickel. By way of example, the thickness of the corrosion resistant metal layer may be about 160 nm. The geometry of the source 20 and drain 22 electrodes are defined in accordance with well known lift-off processes.

Following lift-off, the structure 24 is baked at about 390 K. for approximately 20 minutes in air to drive out any moisture from the structure 24. As an alternative to heating the structure 24, the sample may also be subjected to a vacuum in order to drive out any moisture. Then, the structure 24 is annealed at $1240\pm25$ K. in hydrogen for a period which may range from 5–7 minutes whereby the heat causes the carbide forming metal 26 to form a carbide phase resulting in the electrodes 20 and 22 having a contact resistivity of about $10^{-3}$ to $10^{-4}$ ohm-$cm^2$ to the p-type diamond of the channel 14.

The source and drain electrodes may also be formed on the surface 16 of the semiconducting diamond substrate 12 in accordance with the method set forth in U.S. Pat. No. 5,055,424, "Method For Fabricating Ohmic Contacts On Semiconducting Diamond," incorporated herein by reference. Next, a gate insulator 30, such as amorphous silicon dioxide, silicon nitride, or undoped diamond is formed on the ion implanted surface 16 between the source and drain electrodes 20 and 22, respectively, as for example by indirect plasma enhanced chemical vapor deposition at a temperature of about 570 K., as taught in L. G. Meiners, "Indirect Plasma Deposition of Silicon Dioxide, " *J. Vac. Sci. Technol.,* vol. 21, p. 655, 1982. By way of example, the gate insulator may have a nominal thickness of about 100 nm.

The gate electrode 18 is formed by depositing a layer of a metal 34 on the surface of the gate insulator 30 between the source 20 and drain 22 electrodes using standard lift-off techniques. The gate metal 34 should be a material that adheres well to the gate insulator 30 and have generally low resistivity, and, for example, may be titanium, chromium or alloys of these metals. Titanium is particularly suitable as a gate metal because it adheres well to silicon dioxide, the preferred material for the gate insulator 30. Then, a layer of a corrosion resistant metal 36, such as gold, is formed over the metal 34 forming the gate 22 to prevent the gate metal 34 from oxidizing. By way of example, the layer of metal 34 may be about 10 nm thick and the layer of the corrosion resistant metal may be about 160 nm thick. The layer of the corrosion resistant metal 36 also significantly lower the gate resistance.

The source, gate, and drain electrodes 20, 18, and 22, respectively, may be formed by depositing metal in an ultra-high vacuum system where the pressure during deposition is preferably less than $1\times10^{-7}$ Torr, although a pressure less than $\times10^{-8}$ 0 Torr is preferred.

Figure 2:
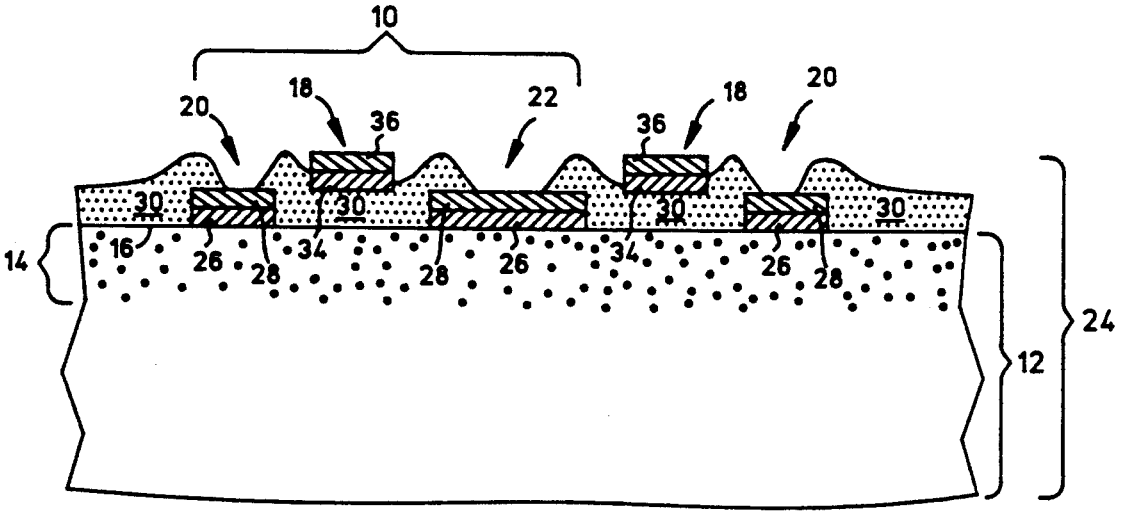
FIG. 2. is a cross-sectional view of another embodiment of an ion implanted diamond MISFET embodying various features of the present invention.
Figure 3:
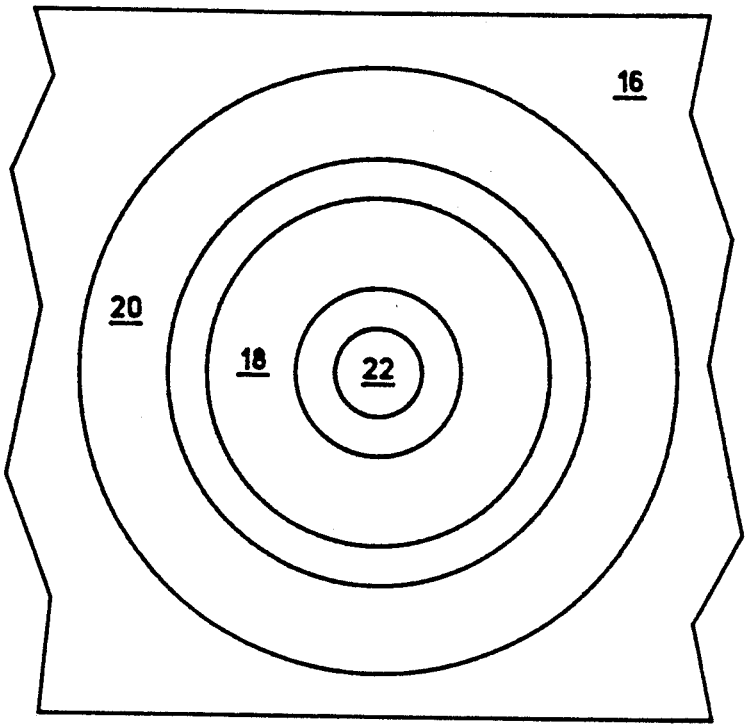
FIG. 3 is a top view of the MISFET shown in FIG. 2.

Referring to FIG. 2, one example of a MISFET 10 embodying various features of the present invention exhibiting suitable performance was generally manufactured in accordance with the teachings set forth herein. However, in the creation of the p-type layer, or channel 14 shown in FIG. 2, the ion implantation was non-selective, that is, the channel was formed in a region coterminous with the entire surface of the diamond substrate 12, rather than in separate regions. The MISFET shown in FIG. 2 was fabricated with a central drain contact 22 which was 400 μm in diameter, and included concentric gate contact 18 and source contact 20, as shown in FIG. 3. The concentric layout of the MISFET 10 shown in FIG. 3 was chosen to produce field confinement without requiring a mesa etch of the diamond substrate 12. The gate contact 18 and source contact 20 were each 200 μm wide, and 1000 μm and 1600 μm in outer diameter, respectively.

The ion implanted region 14 had a hole concentration of $5\times10^{15}$ holes/cm$^3$, and a hole mobility of 30 cm$^2$/V-sec. As used herein, "hole" refers to the absence of an electron from a semiconductor, such as diamond substrate 12, and "hole mobility" refers to the ease with which holes move through a semiconductor when they are subjected to electric forces. It is believed that satisfactory performance of the MISFET 10 may be obtained with an ion implanted region 14 having a hole concentration in the range of $1\times10^{15}$ to $1\times10^{17}$ holes/cm$^3$, and a hole mobility equal to or greater than 1 cm$^2$/V-sec.

Figure 4:
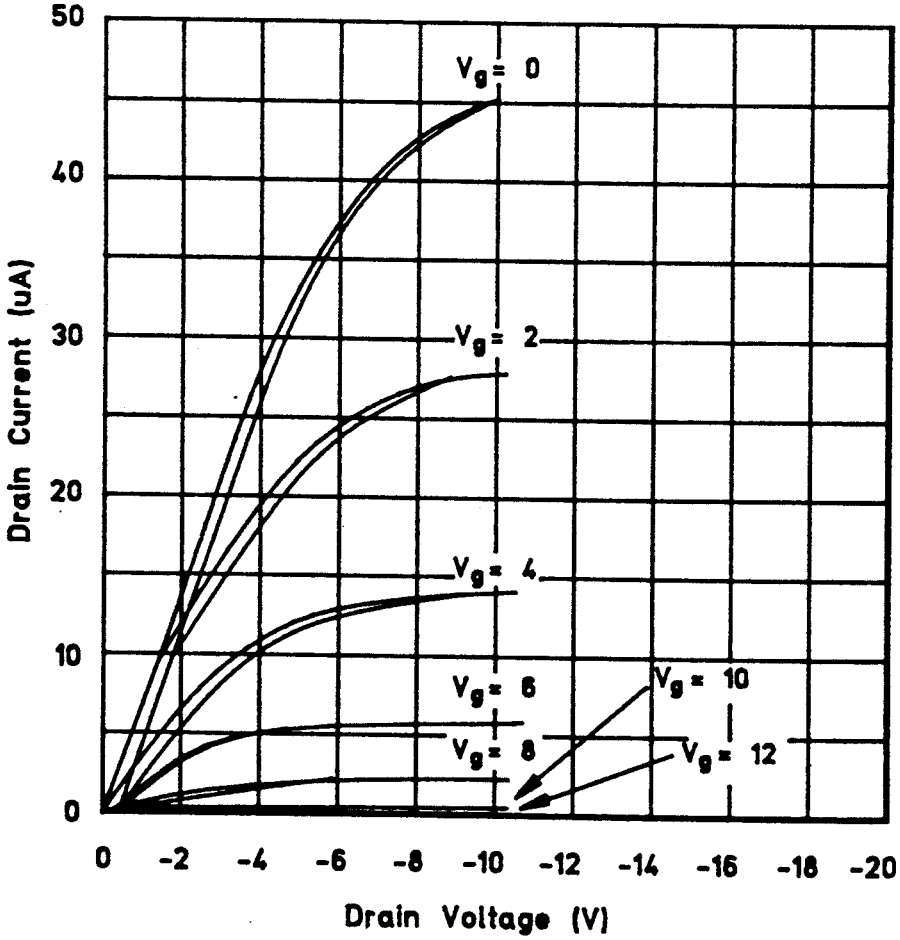
FIG. 4 is a graph representing I(V) characteristics of the ion implanted diamond MISFET of FIGS. 2 and 3.

FIG. 4 illustrates the current-voltage characteristics of the MISFET 10 described with reference to FIGS. 2 and 3 which were measured at room temperature. The source electrode 20 was held at ground potential. The drain electrode 22 received a negative voltage whose magnitude is given by the horizontal axis in FIG. 4. A positive voltage, $V_g$, as shown next to each trace, was applied to the gate 22 and was held constant for each of the traces shown in FIG. 4. For a particular gate voltage, increasingly negative values of the drain voltage result in current saturation, i.e, where:

$$(\Delta\text{drain current})/(\Delta\text{drain voltage})\approx 0.$$

The slope of the curves in saturation provides the output conductance for the MISFET 10. From FIG. 4, the output conductance of the MISFET 10 was determined to be, for example, about 0.15 μS at a gate voltage of 4 V. Saturation and pinch-off were both observed at room temperature. The transconductance was 3.9 μS mm$^{-1}$ and the output conductance was 60 nS mm$^{-1}$. This example of the MISFET 10 thus provided a field effect transistor employing ion implanted diamond.

"Pinch-off" is generally defined as the reduction of saturated drain current to 10% of its maximum value. Pinch-off of transistor current is desirable in applications requiring low noise operation, reduced power consumption, and in applications requiring the generation of digital signals. From FIG. 4 pinch-off is shown to occur at a gate voltage of about 6 volts since the saturated drain current there is a little over 6 μA (about one-tenth of the 50 μA flowing in saturation with 0 volts applied to the gate).

Obviously, many modifications and variations of the present invention are possible in light of the above teachings. Therefore, it is to be understood that within the scope of the appended claims, the invention may be practiced otherwise than as specifically described. Also, rather than implanting a channel 14 in the diamond substrate 12, a channel of conducting diamond could be epitaxially grown on the diamond substrate 12 or on an insulating substrate of some material other than diamond. Furthermore, while the use of the MISFET 10 has been described in conjunction with a non-negative gate bias, it is to be understood that the scope of the invention also includes application of a negative gate bias with an insulated gate.

What is claimed is:

1. A field effect transistor, comprising:

a diamond substrate which has a p-type ion implanted region coterminous with a surface of said diamond substrate;

spaced apart source and drain electrodes formed over said p-type ion implanted region on said surface of said diamond substrate;

an electrically insulating material formed over said p-type ion implanted region on said surface of said diamond substrate between said source and drain electrodes; and a gate electrode formed on said surface of said insulating material.

2. The transistor of claim 1 wherein said ion implanted region of said diamond substrate is manufactured by:

a) cooling and maintaininq said diamond substrate at a temperature of about 80 K.;

b) bombarding said surface of said cooled diamond substrate with about $1.5\times10^{14}$ ions per cm$^2$ to implant said ions in said diamond substrate, said ions having an energy of about 25 keV;

c) bombarding said surface of said cooled diamond substrate with about $2.1\times10^{14}$ ions per cm$^2$ to implant said ions in said diamond substrate, said ions having an energy of about 50 keV;

d) bombarding said surface of said cooled diamond substrate with about $3.0\times10^{14}$ ions per cm$^2$ to implant said ions in said diamond substrate, said ions having an energy of about 100 keV; and e) after bombarding said cooled diamond substrate, placing said cooled diamond substrate in a furnace having a non-oxidizing atmosphere which is maintained at a temperature of about 1260 K. to anneal said diamond substrate and to activate said implanted ions.

3. The transistor of claim 2 wherein said ions are boron ions.

4. The transistor of claim 3 wherein said source and drain electrodes comprise:

a layer of a carbide forming metal formed on said surface of said diamond substrate; and a layer of a corrosion resistant metal formed over said carbide forming metal.

5. The transistor of claim 4 wherein said carbide forming metal is selected from the group consisting of molybdenum, tungsten, chromium, vanadium, niobium, tantalum, titanium, nickel, cobalt, iron, manganese, silicon, boron, zirconium, and hafnium.

6. The transistor of claim 5 wherein said corrosion resistant metal is selected from the group consisting of gold, platinum, palladium, and nickel.

7. The transistor of claim 4 wherein said gate electrode includes a first layer of an electrically conductive metal which adheres to said electrically insulating material and a second layer of a corrosion resistant and electrically conductive metal formed on said first layer.

8. The transistor of claim 7 wherein;

said first layer includes a metal selected from the group of titanium and chromium; and said second layer includes a metal selected from the group of gold, platinum, palladium, and nickel.

9. The transistor of claim 4 wherein said electrically insulating material is selected from the group of silicon dioxide, silicon nitride, and diamond.

10. A field effect transistor, comprising:

a diamond substrate which has a p-type ion implanted region coterminous with a surface of said diamond substrate, wherein said ion implanted region has a hole concentration in the range of $1\times10^{15}$ to $1\times10^{\int}$holes/cm$^3$, and a hole mobility equal to or greater than 1 cm$^2$/V-sec;

spaced apart source and drain electrodes formed over said p-type ion implanted region on said surface of said diamond substrate;

an electrically insulating material formed over said p-type ion implanted region on said surface of said diamond substrate between said source and drain electrodes; and a gate electrode formed on said surface of said insulating material.

11. The transistor of claim 10 wherein said ions are boron ions.

12. The transistor of claim 11 wherein said source and drain electrodes comprise:

a layer of a carbide forming metal formed on said surface of said diamond substrate; and a layer of a corrosion resistant metal formed over said carbide forming metal.

13. The transistor of claim 12 wherein said carbide forming metal is selected from the group consisting of molybdenum tungsten, chromium, vanadium, niobium, tantalum, titanium, nickel, cobalt, iron, manganese, aluminum, silicon, boron, zirconium, and hafnium.

14. The transistor of claim 13 wherein said corrosion resistant metal is selected from the group consisting of gold, platinum, palladium, and nickel.

15. The transistor of claim 14 wherein said gate electrode includes a first layer of an electrically conductive metal which adheres to said electrically insulating material and a second layer of a corrosion resistant and electrically conductive metal formed on said first layer.

16. The transistor of claim 15 wherein; said first layer includes a metal selected from the group of titanium and chromium; and said second layer includes a metal selected from the group of gold, platinum, palladium, and nickel.

17. The transistor of claim 16 wherein said electrically insulating material is selected from the group of silicon dioxide silicon nitride, and diamond.

* * * * *